(12) United States Patent
Dakhil

(10) Patent No.: US 11,588,420 B2
(45) Date of Patent: Feb. 21, 2023

(54) THERMO-DIELECTRIC-ELASTOMER-CELL

(71) Applicant: Farouk Dakhil, Rome (IT)

(72) Inventor: Farouk Dakhil, Rome (IT)

( * ) Notice: Subject to any disclaimer, the term of this patent is extended or adjusted under 35 U.S.C. 154(b) by 17 days.

(21) Appl. No.: 17/405,430

(22) Filed: Aug. 18, 2021

(65) Prior Publication Data

US 2022/0060127 A1 Feb. 24, 2022

Related U.S. Application Data

(60) Provisional application No. 63/066,845, filed on Aug. 18, 2020.

(51) Int. Cl.
 *H02N 11/00* (2006.01)
 *F24S 70/10* (2018.01)
 *H02N 10/00* (2006.01)

(52) U.S. Cl.
 CPC ............ *H02N 11/002* (2013.01); *F24S 70/10* (2018.05); *H02N 10/00* (2013.01)

(58) Field of Classification Search
 CPC ........ H02N 11/002; H02N 10/00; H02N 2/18; F24S 70/10; Y02E 10/40; Y02E 10/50; H01L 41/193; H02S 99/00
 See application file for complete search history.

(56) References Cited

U.S. PATENT DOCUMENTS

| | | |
|---|---|---|
| 8,680,514 B2 | 3/2014 | Park et al. |
| 9,732,967 B2 * | 8/2017 | Dakhil ............... F03D 9/25 |
| 9,741,882 B2 * | 8/2017 | Gaspari ........... H01L 31/035218 |
| 2005/0074915 A1 * | 4/2005 | Tuttle .................. H01L 31/0322 438/57 |
| 2008/0264473 A1 * | 10/2008 | Cumpston ............. H01L 31/046 257/E27.125 |
| 2016/0315583 A1 * | 10/2016 | Dakhil .................... H02S 20/30 |

OTHER PUBLICATIONS

Carpi et al., "Stretching Dielectric Elastomer Performance", Science, 2010, pp. 1759-1761, vol. 330; DOI: 10.1126/science.1194773; 4 pages.

Ndao et al., "Octave bandwidth photonic fishnet-achromaticmetalens", Nature Communications, 2020, pp. 1-6; doi.org/10.1038/s41467-020-17015-9; 6 pages.

(Continued)

*Primary Examiner* — Hoang M Nguyen
(74) *Attorney, Agent, or Firm* — Maier & Maier, PLLC

(57) ABSTRACT

Methods, systems, and apparatuses related to thermo-dielectric-elastomer-cells may be shown and described. In one embodiment a thermo dielectric elastomer cell (TDEC) can include a layer of carbon nanotubes that absorb sunlight; a layer of photo switchable molecules; a plurality of dielectric elastomer layers, each of the plurality of dielectric elastomer layer comprising a layer of dielectric elastomer material and a layer of N-P junction transistors between the layers of dielectric elastomer material; a layer of insulators separating each of the plurality of dielectric elastomer layers; and an elastic cushioning which is placed between the plurality of dielectric elastomer layers and surrounding the dielectric elastomer material.

12 Claims, 8 Drawing Sheets

(56) References Cited

OTHER PUBLICATIONS

Han et al., "Optically-controlled long-term storage and release of thermal energy in phase-change materials", Nature Communications, pp. 1-10; DOI: 10.1038/s41467-017-01608-y; 10 pages.

Peters et al., "The Impact of Global Warming on Silicon PV Energy Yield in 2100", Massachusetts Institute of Technology; arxiv.org/abs/1908.00622; 3 pages.

Xu et al., "A droplet-based electricity generator with high instantaneous power density", Nature, 2019; doi.org/10.1038/s41586-020-1985-6; 16 pages.

Zhao et al., "Ultralow thermal conductivity and high thermoelectric figure of merit in SnSe crystals", Nature, 2014, vol. 508; doi:10.1038/nature13184; 17 pages.

* cited by examiner

THERMO-DIELECTRIC-ELASTOMER-CELL

CROSS-REFERENCE TO RELATED APPLICATIONS

The present patent application claims benefit and priority to U.S. Provisional Patent Application No. 63/066,845 filed on Aug. 18, 2020 which is hereby incorporated by reference into the present disclosure.

BACKGROUND

Heat has become an ever increasing and unmanageable source of energy in industry. Simultaneously heat has caused continuous temperature rise due to climate change i.e. global warming.

There is a huge worldwide interest in solar photovoltaic as an alternative clean environmentally friendly energy, however the energy density of solar photovoltaic panels/arrays are too insignificant to meet world energy needs (photovoltaics amount to less than 1% of energy supply needs) Commercial solar photovoltaic panels typically average between 10 and 15% efficiency. As a result the highest power density achieved is around 20-23 W/m2 in desert located solar pv-farms. Other places, such as solar farms in Germany for example, normally achieve even less, only around 5-7 W/m2. Additionally global warming will cause a decrease in overall efficiency of the PV modules used around the word. (see MIT report: Ref: arxiv.org/abs/1908.00622: "The Impact of Global Warming on Silicon PV Energy Yield in 2100".)

Total solar irradiance (TSI)—the amount of solar radiation received at the surface of earth has been measured by NASA and ESA satellite experiments to be 1.361 kilowatts per square meter (kW/m$^2$). However, infrared waves are electromagnetic radiation, longer than visible light and make up slightly more than half of the total energy coming from the Sun.

A huge amount of energy is lost in the form of heat, not only in photovoltaics but also in many manufacturing and chemical processes such as internal combustion engines, that could be harness and/or regained as a form of useful energy as electricity. However, the conversion of heat into electricity was and is up to date very difficult, and where possible is also at very low energy density. So called Peltier/Seebeck effect, in which the temperature difference between two types is converted to electricity but only very small amount of energy is recovered, generally in the range of 3-10% and lately possibly 20%. Said thermocell configuration is made of SeSn, tin solenide, which has very high Seebeck coefficient and high ZT. (see Mercuri et al in Nature, Apr. 14, 2014 doi:10.1038/nature13184)

This new material tin solenide, SeSn, which is based on the common semiconductor telluride, is environmentally stable and is expected to convert from 15 to 20 percent of heat to electricity. The SeSn material exhibits a thermoelectric figure or "ZT" of 2.2, which is the highest reported.

As can be seen, a lot of the sun irradiation energy is lost, and an efficient material and technology is needed to absorb the most possible of this energy and convert it into useful form of energy, preferably electricity. This is exactly the scope of the embodiments:

However, the embodiments show that it is possible to convert heat into useful electricity and recover much energy here from solar heat energy at very high energy densities and efficiencies of up to 80-90%. The smart material dielectric elastomer which was first discovered by Alexander Volta, and has lately found use in areas such as artificial muscles in robots, has very high power density. Dielectric Elesatomer (DE) is a sub group polymer of electro-active-polymers (EAP).

Thus, the embodiments of the new thermo dielectric elastomer cell (TDEC) are special solar energy conversion technology. Heat waves or pulses are generated at precise intervals to form photo-switchable molecules (PSMs) in order to exert pressure upon a smart material DE, the DE material is able to compress and decompress, or expand and contract again and again in a kind of oscillation mode, thus generating an electric current at very high power density (4 watt/g.). The PSM works as a heat battery, with just an electric impulse or light impulse heat "waves" can be generated on and off.

A disk made of micro or nano-rods of semi-crystalline polypropylene (PP) (with $\alpha$ equal to 155 at 20° C. and 10-6 K−1) which has highest linear expansion coefficient is placed on top of the DE material to allow for maximum expansion and contraction as the PSM material is switched on and off, thus generating continuous electric current. Quartz (lowest expansion coefficient $\alpha$ equal to 0.59 at 20° C. and 10-6 K−1) can be placed around the PP polypropylene disk. Its form may be, for example, a cylinder to allow the expansion of the same only in one direction i.e downwards to compress the DE material underneath. (see thermal expansion table). The Cylinder 107 may alternatively be of any other material with a low expansion coefficient.

The change in the linear dimension can be estimated by the following equation $$\alpha L = 1/L \cdot dL/dT$$

Where alpha ($\alpha$) is the thermal coefficient at 20° C. (and 10-6 K−1), L is the linear length or surface area of disk or rod, T is the temperature, and d is the fractional change in length or in temperature.

Thus, lenses concentrate solar heat upon black carbon nanotubes (CNTs) disk to cause expansion and exert pressure upon the dielectric material underneath it in such a way that the expansion is also directed mainly downwards through the effect of the low expansion coefficient material quartz that encapsulate the highly expandable material PP.

In addition to the heat absorption from sun rays the dielectric elastomer layers are compressed and decompressed by any mechanical movement or vibration caused by wind energy, rain drops impact or any vibrational or movement that can cause compression of said DE material layers and thus contribute to the overall power generation within the TDEC.

Further, the TDEC may have a circular or quadratic form in order to save space and maximize energy density per square meter where there is an array of solar TDEC panels.

Furthermore, in countries with extensive rains, like Norway's West Coast where it rains for 274 days a year and thus solar energy density is almost nil, It would be/is much more efficient to use the last design of the TDEC for harnessing heat into electricity without any concentrating lenses 100 on top but let the rain drops fall directly on the dielectric elastomer layer in order to generate electrical current directly instead of any "heat waves" from the heat battery that could also be excluded to save material cost as well. In fact, "effect can generate electricity induced by contact electrification and electrostatic induction when a droplet hits a surface . . . . In order to improve the conversion efficiency, the research team has spent two years developing the DEG. Its instantaneous power density can reach up to 50.1 W/m2, thousands times higher than other similar devices without the use of FET-like design. And the energy conversion efficiency is markedly higher." (See Nature, 2020; DOI: 10.1038/s41586-020-1985-6)

The main advantages of the TDECare as follows:

1. High power density output (4 Watt/g.) and even more via electrostatic induction.

2. Low cost of materials compared with silicon mono-crystalline wafers or poly-crystalline silicon.

Simple and efficient manufacturing.

3D printing is possible by even multi material machine (like Autodesk Voxx 3D printer) and thus no material waste and low production cost, which amounts to almost one third of a usual poly-crystalline silicon solar PV wafer in comparison with one TDEC.

No batteries may be needed for field application as "heat batteries" are integrated within the actual Solar Cell and hence low installation and maintenance costs.

A TDEC panel can be just used as a normal solar PV-panel, while requiring less area, as solar energy conversion with TDEC is much more efficient; approximately eight to ten times more energy than other solar pv panels.

Power supply can be achieved 24/7 day and night with no external batteries needed, as the PSM acts like a heat battery.

SUMMARY

Methods, systems, and apparatuses related to thermo-dielectric-elastomer-cells may be shown and described. In one embodiment a thermo dielectric elastomer cell (TDEC) can include a layer of carbon nanotubes that absorb sunlight; a layer of photo switchable molecules; a plurality of dielectric elastomer layers, each of the plurality of dielectric elastomer layer comprising a layer of dielectric elastomer material and a layer of N-P junction transistors between the layers of dielectric elastomer material; a layer of insulators separating each of the plurality of dielectric elastomer layers; and an elastic cushioning which is placed between the plurality of dielectric elastomer layers and surrounding the dielectric elastomer material.

In another embodiment, a solar panel can include a frame; a plurality of TDECs within the frame, each TDEC comprising a layer of carbon nanotubes that absorb sunlight; a layer of photo switchable molecules; a plurality of dielectric elastomer layers, each of the plurality of dielectric elastomer layer comprising a layer of dielectric elastomer material and a layer of N-P junction transistors between the layers of dielectric elastomer material; a layer of insulators separating each of the plurality of dielectric elastomer layers; and an elastic cushioning which is placed between the plurality of dielectric elastomer layers and surrounding the dielectric elastomer material.

BRIEF DESCRIPTION OF THE FIGURES

Advantages of embodiments of the present invention will be apparent from the following detailed description of the exemplary embodiments. The following detailed description should be considered in conjunction with the accompanying figures in which.

Exemplary

Exemplary

Exemplary

Exemplary

Exemplary

Exemplary

Exemplary

DETAILED DESCRIPTION OF THE EMBODIMENTS

Figure 1:
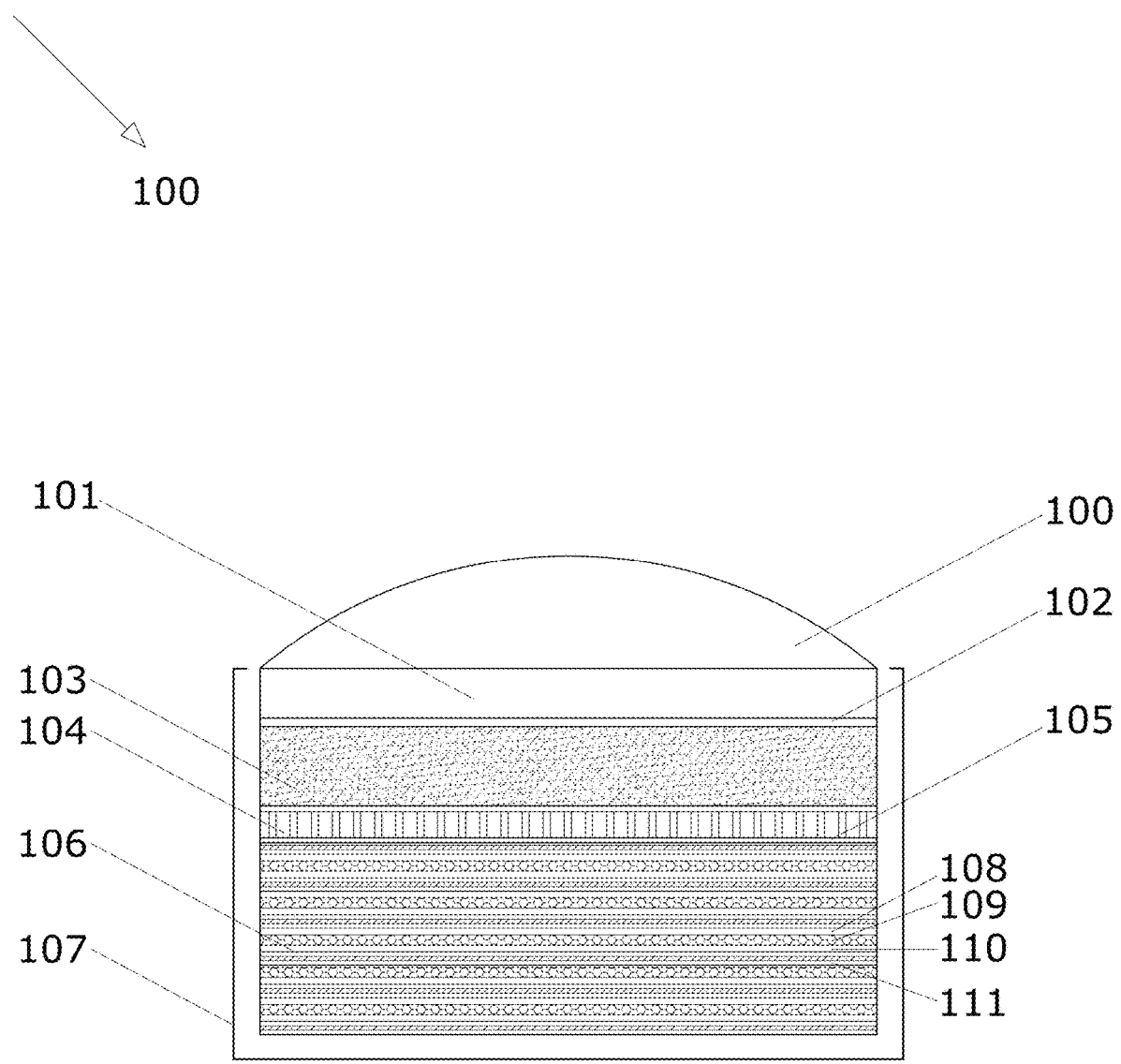
FIG. 1 shows a detailed arrangement of a first embodiment of the solar high concentrated TDEC Exemplary

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

In countries with extensive rains, like Norway's West Coast where it rains for 274 days a year and thus solar energy density is almost nil, It would be/is much more efficient to use the last design of the TDEC for harnessing heat into electricity without any concentrating lenses 100 on top but let the rain drops fall directly on the dielectric elastomer layer in order to generate electrical current directly instead of any "heat waves" from the heat battery, this also allows exclusion of materials in order to save material cost. In fact, "effect can generate electricity induced by contact electrification and electrostatic induction when a droplet hits a surface . . . . In order to improve the conversion efficiency, the research team has spent two years developing the DEG. Its instantaneous power density can reach up to 50.1 W/m$^2$, thousands of times higher than other similar devices without the use of FET-like design. And the energy conversion efficiency is markedly higher." (See *Nature*, 2020; DOI: 10.1038/s41586-020-1985-6)

Further, water drops could be made to fall from a high artificial ceiling which may have a form like a greenhouse structure in which water drops would fall on these TDEC-panels and cause this desired effect, generating electricity at very high density induced by contact of rain drops falling on the surface of the solar TDEC herein specified. Additionally, said greenhouse may also contain, for example, agricultural water pipes filled with water so that when the water evaporates to the ceiling of the greenhouse water drops from the ceiling then on the TDECs in a continuous circulation water cycle. (see article for greenhouse water agriculture doi: 10.1007/s13593-018-0540-4)

Flare stack emissions and smoke are strictly regulated by provincial governments. In recent years, refineries themselves have worked hard to develop systems that recover and reprocess excess materials, which has reduced flaring.

"Flare stacks are generally located at the highest point in a refinery," says Morel. "This assists with emission dispersion, and complying with ground level concentration limits stipulated by government requirements."

Read more about how refinery air emissions have dropped considerably since 2003, and how transportation fuels are getting cleaner all the time.

Flaring also reduces emissions that would otherwise go into the atmosphere by 98 percent, he adds. The process combusts and breaks down gaseous compounds from their original state to carbon dioxide.

In addition, flat metallic lenses could be used instead of bulky glass or acrylic lenses 98 which resist to heat in flare stacks, for example, and other applications like in our solar house or roof top of our electromagnetic power generator vehicle. See Nature Communications (2020). DOI: 10.1038/s41467-020-17015-9.

For the detailed description of the embodiment following figures disclosed as follows:

FIG. 1 shows the embodiment of an exemplary arrangement in which a lens 98 that may be made of acrylic or transparent graphene oxide reinforced lignin, concentrates sun light on a layer of carbon nano tubes 102 which is placed at the focal point of the lens 98. In between there is an empty space 101 which acts as a heat chamber.

There is a quartz rigid walls cylinder-like 107 placed along the sides of the PP and the DE multi layered material to prevent side wards expansion and keep all expansion pressure directed downwards towards the DE material.

Graphene oxide polymer composite maybe be used as electrodes to conduct current in series interconnecting all TEDCs.

there may be a new state-of-the-art material PSM 103 which works as a heat battery by storing the heat collected during daytime for the night that would function as a source of electric power and heat. (see Tim Kucharski in Nature Chemistry, Apr. 13, 2014, doi: 10.1038/nchem.1918). The key issue in making this "heat battery" of PSM work is the interactions between azobenzene molecules on neighbouring CNTs. PSM is a material that can absorb the sun's heat and store that energy in chemical form in combination and interaction with azobenzene, which is then ready to be released again on demand. This combination with azobenzene makes the material very efficient in heat storage, an about 200 percent increase to normal CNT material for optimal heat conductivity generated inside the TDEC.

There is a CNT 102 layer to absorb most of the heat from sun light and transmit it to the PSM 103, heat battery (not shown) below for storage during night and/or whenever needed.

CNT are extremely efficient absorbers of sunlight, which convert almost the entire solar spectrum into heat. Therefore inside a micro container/cell directly at the focal point of the acrylic (or graphene reinforced bio-degradable lignin material) lenses 98.

The system is disclosed in which solar heat power compresses smart electro-active polymers (EAP) material and this case DE material. DE 106 converts sun heat power into pressure into electrical current by compressing and decompressing said DE material 106. Advantageously, DE has a very high power density and elasticity. The resultant electrical power may be stored in a battery or directly used in any application.

Further, in order to absorb any mechanical or vibrational movements, there may be another set of micro pistons 104 in a case 105 made of graphene oxide that may have the function of springs in order to increase and or facilitate the compression and decompression of the DE material 106. (see for example this type of micro pistons: https://zortrax.com/z-semiflex/). Such micro pistons/cylinders have only a sense when the TDEC are in the open and exposed to wind power or vibrations or movements as in vehicles or airplanes.

There may be an empty space 101 which allows the expansion and the counter pressure of a plurality of micro pistons in a case 105. 108 and 109 are insulators while 106 and 109 are the DE material on different layers one on top of the other separator by N-P junctions 108 and 110

Each layer may have an N-P junction with DE material 106 and 109 sandwiched in between. There are cushions 111 in between that allow the elasticity of the compression and decompression of the DE materials 106 and 109. Thus, 111 is elastic cushioning material that is placed in between the layers and on the sides and surrounding the DE material which may provide structural support and elasticity, and may protect the power generation layers of the DE material.

The concept of DEs were historically discovered first around 1775 by French Nicolas-Phillipe Ledru. For example, Ledru discovered that a substance or a material can be deformed or altered in volume, length or width by an electric current. In particular, Ledru noticed mercury, in a temperature column, would rise if current was applied. Then, in 1776, Italian Alessandro Volta explained the volume changes in a Leyden jar when an electric current passed through it and he was the first to give the right interpretation of this phenomenon. Later, in 1880, German physicist Wilhelm Conrad Röntgen described how a rubber substance would increase in length if current was applied to it. This was the birth of the so-called actuators of electro-active polymers of today's understanding. (See F. Capri et. al in *Science Vol* 330, 1759-1761)

The concept was then elaborated on in the early nineties when Ron Pelrine and his co-workers developed this new concept and experimentally showed in details at MIT's labs. Later, at the Stanford Research Institute (SRI), R. D. Kornbluh and colleagues found DE materials with high-speed, giant-strain and electrically actuated elastomers with excellent electromechanical transduction performance which, in the generator mode, produced very high power density electrical current if pressurized from the outside, as reported in *Science vol.* 287 p. 836.

Figure 1A:
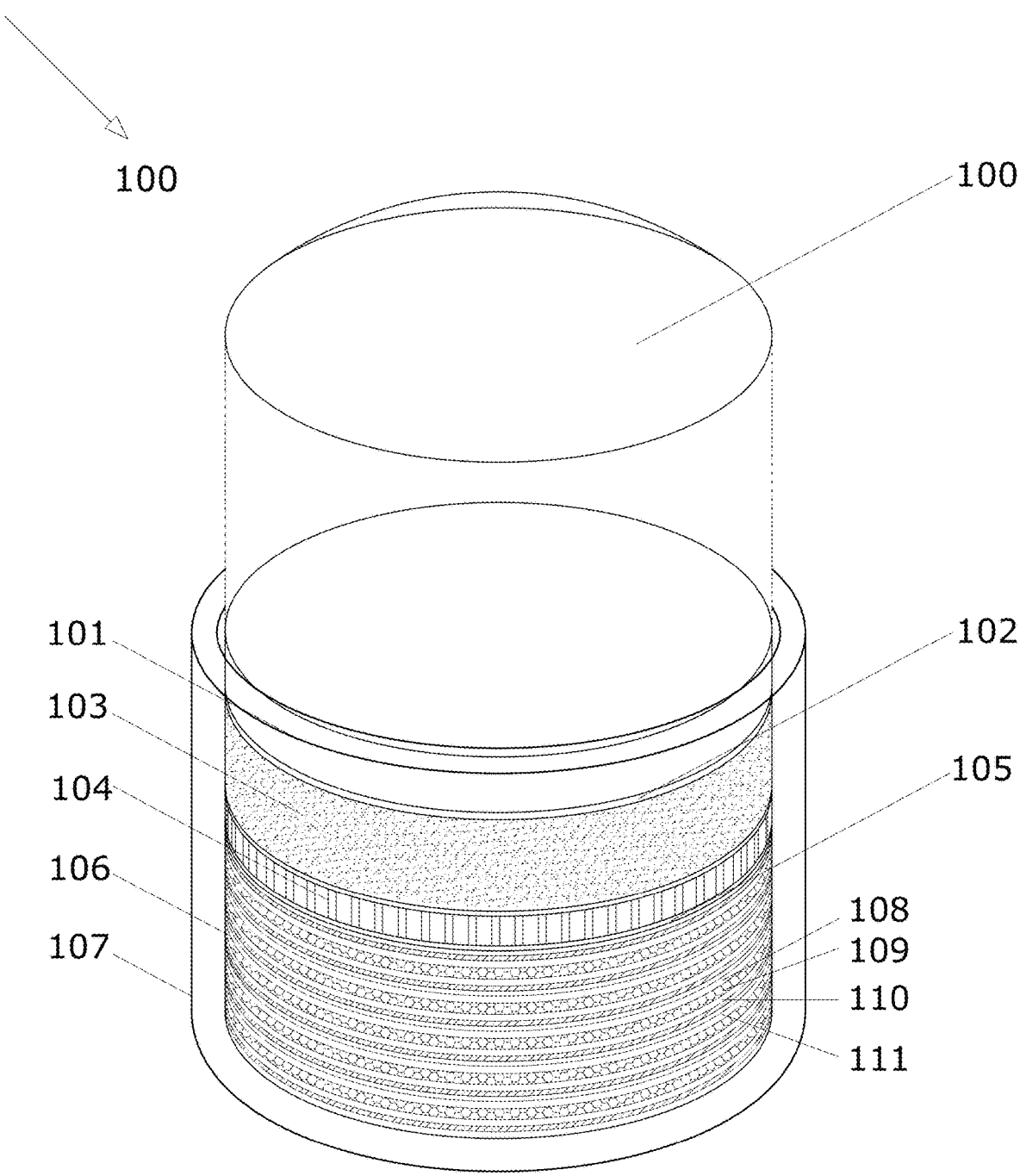
FIG. 1A shows the same TDEC in an "explosive mode" showing the parts of the TDEC separated in vertical space.

FIG. 1A shows the same embodiment in a clearer "explosive" mode showing all parts of the TDEC separated from each other.

Figure 1B:
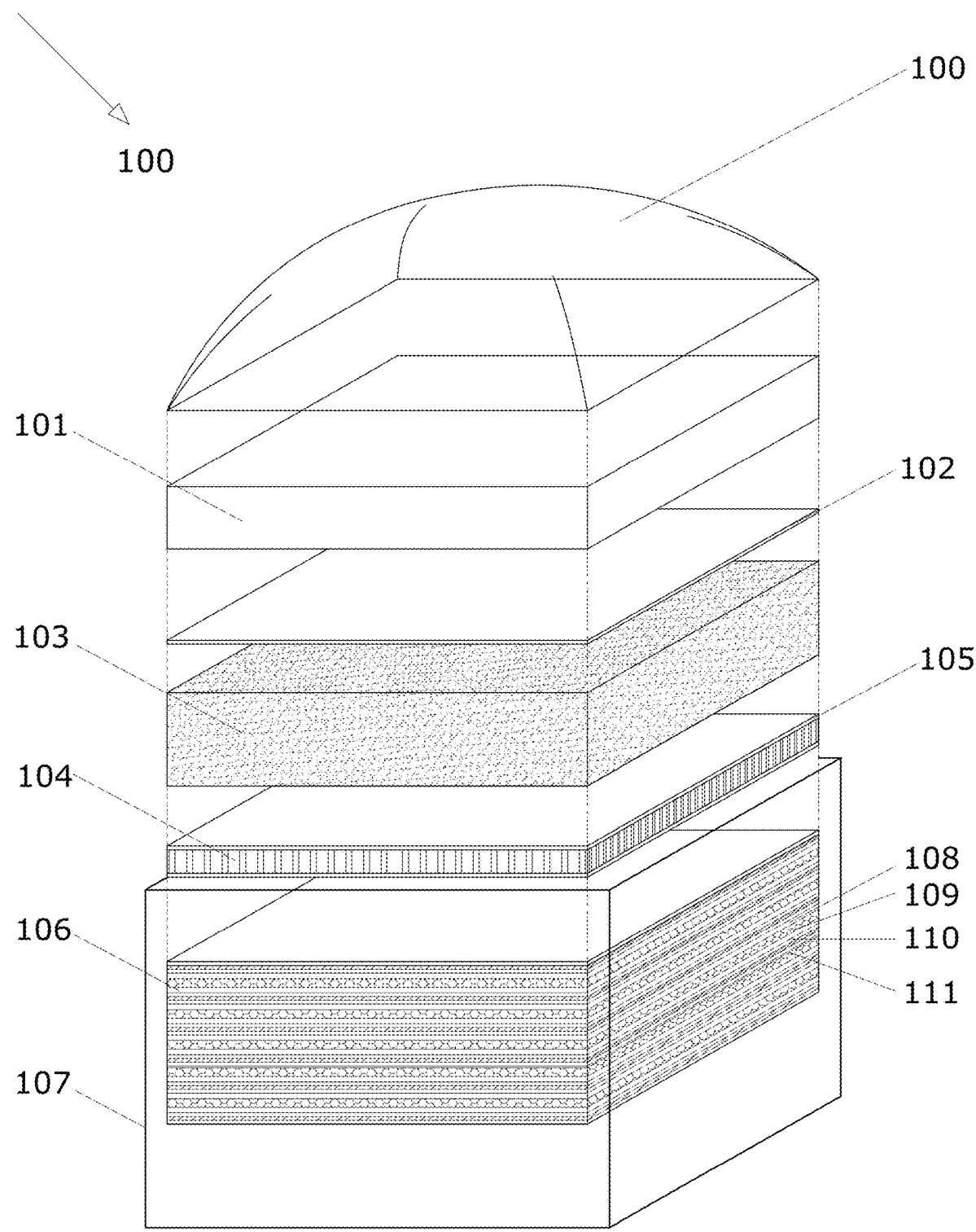
FIG. 1B shows a quadratic form of the TDEC, a form to maximize solar insulation space.

FIG. 1B shows again the same embodiment of the TDEC but in a quadratic form in order to increase the efficiency of the solar cell output by increasing the useful area of the sun insulation of the solar panel.

Figure 2:
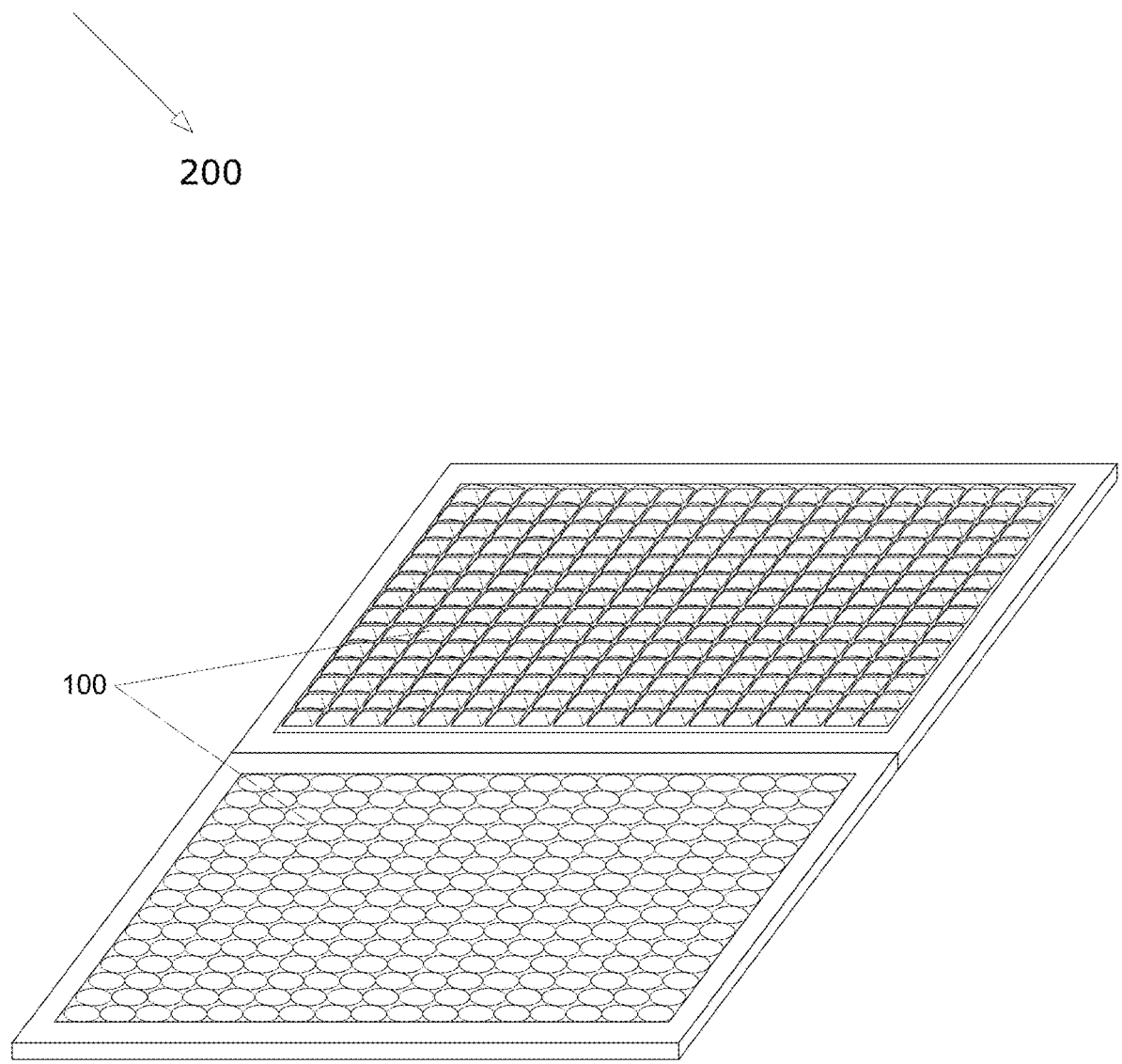
FIG. 2 shows a solar panel of said TDEC in the two forms round and quadratic.

FIG. 2 shows the actual solar panel 200 in its two forms of TDECs as round or square cells in two separate solar panels.

Figure 3:
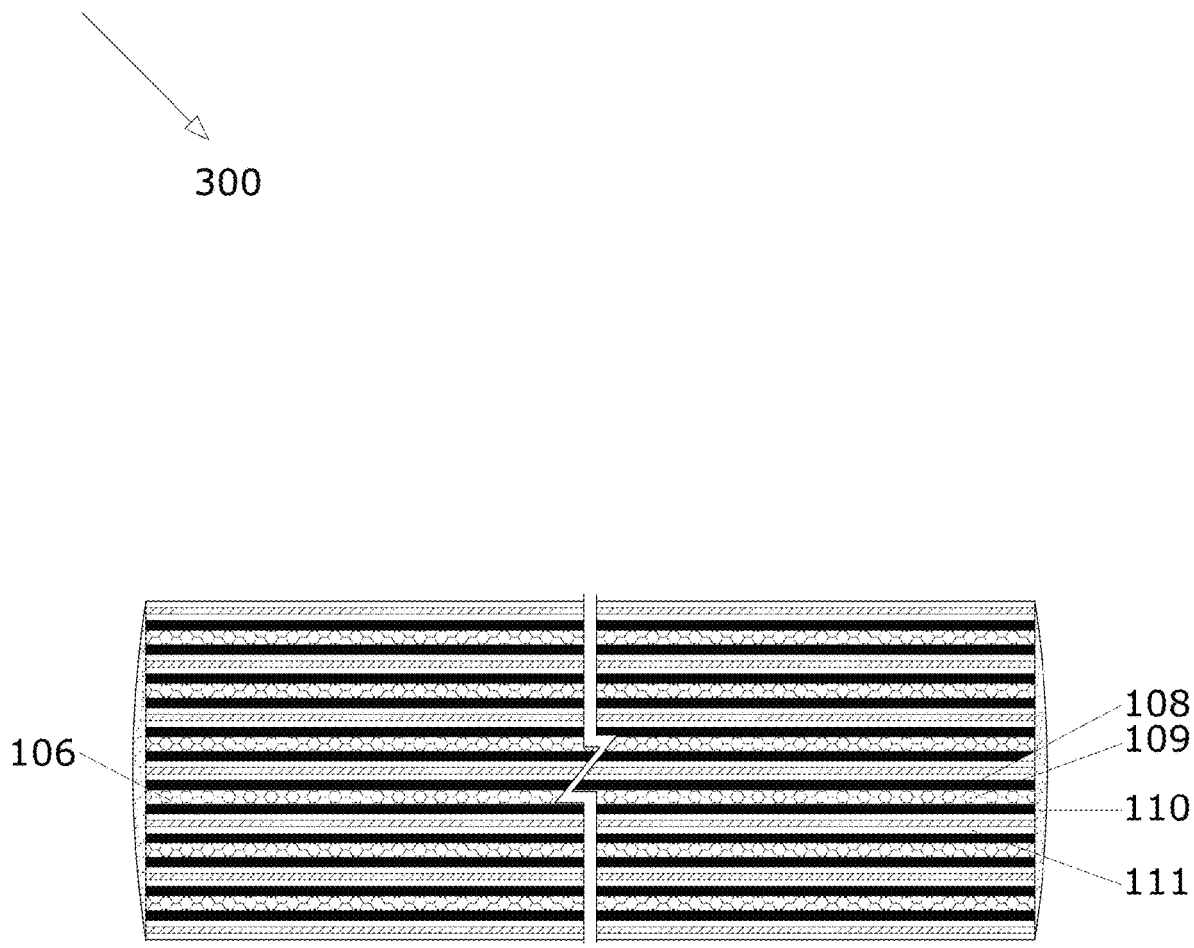
FIG. 3 shows the dielectric elastomer multi-layer assembly for maximum solar power output.

FIG. 3: Now referring to exemplary FIG. 3, the power generation layer 300 may include a multilayer of dielectric elastomer DE materials. Dielectric elastomer may generate an electric current when compressed or decompressed by the forces of the ocean waves. Each layer may have an N-P junction 108, 110 with DE material 106 sandwiched in between. An insulator 108,109 may insulate the layers from each other and an elastic cushioning material 111 may provide structural support and elasticity, and may protect the power generation layers through the various stresses which may be encountered in waves of heat induced by the PSM unit 103. The multilayer dielectric elastomers DE 300 in all its parts as a sandwiched embodiment in which the DE material 106 is placed between two electrodes positive 109 and negative 108 respectively.

The black material 110 is an insulation layer separating each electrode from the one below it. There is also a protecting outer side elastic cushioning 111 engulfing the multilayer DE 106 material to keep it all together in one embodiment.

Figure 4:
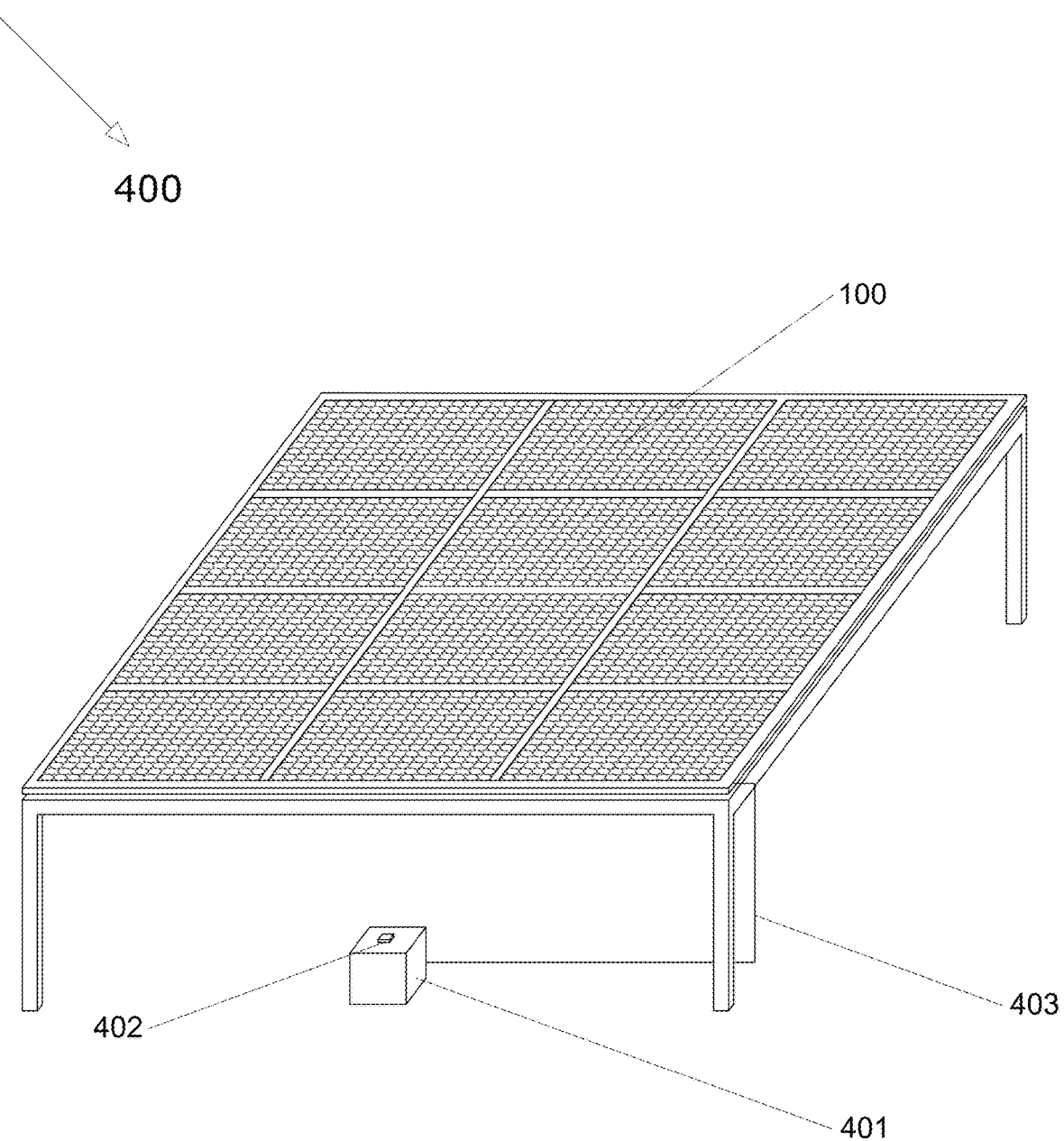
FIG. 4 shows a solar array made of several solar panels connected to a battery and an invertor.

FIG. 4 shows an array 400 of solar panels either in its round or square form TDECs placed in a perfect angel toward south to absorb maximum amount of solar energy. There may be a battery 401 placed under the array assembly 400 connected by wire 403 to store polar electric power for later use as at nighttime. There may also be a sensor 402 on the battery to protect the battery from being overloaded and indicating the stored power inside the battery 401.

Figure 5:
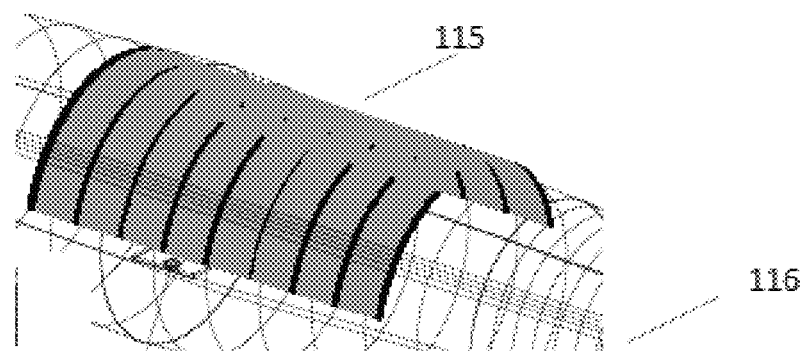
FIG. 5 shows an application of the solar TDEC in a flexible form around a hot (water or any other material or substance) tube converting heat into useful electric energy.
Figure 5A:
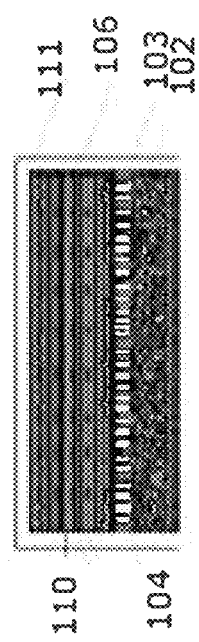
FIG. 5A shows details of the 180° inverted TDEC to be placed on top of a hot tube or any other heat source for conversion of heat into electric power.

FIG. 5 Shows an exemplary TDEC at 180° inverted (without the lens 100) upside down as the heat body or source need to be in contact with the CNT layer to heat the PSM 103 on top in order to allow the DE layers 106 to expand and thus create the necessary compression and decompression upon the dielectric elastomer to generate electric current at very high energy density and conversion rate of heat into electricity.

The invention claimed is:

1. A thermo dielectric elastomer cell (TDEC) comprising:
   a layer of carbon nanotubes that absorb sunlight;
   a layer of photo switchable molecules;
   a plurality of dielectric elastomer layers, each of the plurality of dielectric elastomer layer comprising a layer of dielectric elastomer material and a layer of N-P junction transistors between the layers of dielectric elastomer material;
   a layer of insulators separating each of the plurality of dielectric elastomer layers; and
   an elastic cushioning which is placed between the plurality of dielectric elastomer layers and surrounding the dielectric elastomer material.

2. The TDEC of claim 1, further comprising a lens that focuses sunlight onto the layer of carbon nanotubes; and an empty space situated between the lens and the layer of carbon nanotubes.

3. The TDEC of claim 2, wherein the lens is made of one of transparent acrylic graphene oxide reinforced lignin, or acrylic graphene oxide reinforced lignin.

4. The TDEC of claim 2, wherein the lens is a flat metallic lens.

5. The TDEC of claim 1, further comprising a rigid quartz wall which surrounds the sides and bottom of the TDEC.

6. The TDEC of claim 5, wherein the rigid quarts wall is a cylinder.

7. The TDEC of claim 5, wherein the rigid quarts wall is a quadratic.

8. The TDEC of claim 1, further comprising a layer of micro pistons situated between the layer of photo switchable molecules and the plurality of dielectric elastomer layers; and
   a case that surrounds the layer of micro pistons.

9. The TDEC of claim 8, wherein the micro pistons are made of graphene oxide.

10. A solar panel comprising:
    a frame;
    a plurality of TDECs within the frame, each TDEC comprising a layer of carbon nanotubes that absorb sunlight;
    a layer of photo switchable molecules;
    a plurality of dielectric elastomer layers, each of the plurality of dielectric elastomer layer comprising a layer of dielectric elastomer material and a layer of N-P junction transistors between the layers of dielectric elastomer material;
    a layer of insulators separating each of the plurality of dielectric elastomer layers; and
    an elastic cushioning which is placed between the plurality of dielectric elastomer layers and surrounding the dielectric elastomer material.

11. The solar panel of claim 10, further comprising a battery capable of storing energy; and
    a wire connecting the solar panel to the battery.

12. The solar panel of claim 11, further comprising a sensor connected to the battery which protects the battery from being overloaded and indicates the amount of power stored in the battery.

* * * * *